United States Patent [19]

Zhukovsky et al.

[11] Patent Number: 5,332,988

[45] Date of Patent: Jul. 26, 1994

[54] REMOVABLE COIL FORM FOR SUPERCONDUCTING NMR MAGNETS AND A METHOD FOR ITS USE

[75] Inventors: Alexander Zhukovsky, Brighton; Yukikazu Iwasa, Weston; Emanual Bobrov, Cambridge; John E. C. Williams, Wayland, all of Mass.

[73] Assignee: Massachusetts Institute of Technology, Cambridge, Mass.

[21] Appl. No.: 884,634

[22] Filed: May 15, 1992

[51] Int. Cl.⁵ .................. H01F 1/00; H01F 27/30; B65H 54/00
[52] U.S. Cl. ......................... 335/216; 242/1; 336/208; 336/DIG. 1
[58] Field of Search ............. 335/216, 250, 299; 336/198, DIG. 1, 208; 242/118, 1, 50; 140/92.1, 92.2

[56] References Cited

U.S. PATENT DOCUMENTS

| | | | |
|---|---|---|---|
| 3,284,748 | 11/1966 | Matsumoto | 336/198 |
| 3,837,891 | 9/1974 | Tietz | 117/46 FA |
| 3,849,181 | 11/1974 | Green | 117/106 R |
| 4,078,741 | 3/1978 | Underwood | 242/118.61 |
| 4,130,256 | 12/1978 | Hosbein | 242/118.4 |
| 4,268,353 | 5/1981 | Powell et al. | |
| 4,270,264 | 6/1981 | Weisse | |
| 4,554,731 | 11/1985 | Bordon | |
| 4,694,868 | 9/1987 | Jahnke | |
| 4,830,300 | 5/1989 | Taylor | 242/54 R |
| 5,065,497 | 11/1991 | Jarabak et al. | |

FOREIGN PATENT DOCUMENTS

| | | | |
|---|---|---|---|
| 0091505 | 6/1982 | Japan | 242/118 |
| 0103306 | 6/1982 | Japan | 335/216 |
| 62-85411 | 4/1987 | Japan | H01F 7/20 |
| 0126205 | 5/1988 | Japan | 335/216 |
| 0209110 | 8/1988 | Japan | 336/198 |

OTHER PUBLICATIONS

H. Minemura et al., "Fabrication of a 3 m φ× 5 m Superconducting Solenoid for the Fermilab Collider Detector Facility", *J. de Phys.* 45(C1), 333-336 (Jan., 1984).
H. Minemura et al., "Feasibility Test of a Shrink-Fit Assembly of a Large-Diameter Superconducting Solenoid for a Colliding Beam Detector", *Nuc. Instr. Meth. Phys. Res.* 219, 472-4787 (1984).
J. A. Carson and R. Bossett, "A Technique for Epoxy Free Winding and Assembly of Coa θ Coils for Accelerator Magnets", *IEEE Trans. Mag.* Mag-23(2), 1244-1246 (Mar., 1987).

*Primary Examiner*—Leo P. Picard
*Assistant Examiner*—Stephen Ryan
*Attorney, Agent, or Firm*—Choate, Hall & Stewart

[57] ABSTRACT

A superconducting coil is mounted on a permanent non-magnetic coil form by first winding an unreacted wire onto a temporary coil form made of refractory materials which can be assembled and disassembled, reacting the wound unreacted wire at high temperatures to form a superconducting coil. The temporary coil form is disassembled and the superconducting coil is transferred to a permanent coil form made of a non-magnetic material. The temporary coil form includes a bore tube and an end flange made of a refractory material and a terminal flange made of a non-magnetic refractory material. The terminal flange is removably secured to the bore tube. The end flange is positioned next to the other end of the bore tube and held in position against the tube by means of an end plate. A terminal plate is removably positioned adjacent to the bore tube. The assembly is held together by means of an axial force on the terminal and end plates. The superconductor wire can be wound around the outer surface of the bore tube to form a superconducting coil.

21 Claims, 3 Drawing Sheets

REMOVABLE COIL FORM FOR SUPERCONDUCTING NMR MAGNETS AND A METHOD FOR ITS USE

FIELD OF THE INVENTION

This invention relates to superconducting coils for high field NMR magnets. The invention further relates to removable coils forms and non-magnetic coil forms for supporting the superconducting coil.

BACKGROUND OF THE INVENTION

A class of superconducting magnet generating a highly uniform field is required for nuclear magnetic resonance (NMR) spectroscopy. The uniformity of the field requires accurate positioning of the turns of the superconductor coil in a precisely defined geometry. It also requires that proximity of the superconducting coil with materials having a magnetic susceptibility greater than zero be avoided. Thus, all ferrous alloys, including so-called "non-magnetic" stainless steel, must be eliminated from the structure and windings of the NMR magnet.

High field superconducting magnets typically use niobium-tin superconductor. The superconductor is wound in the form of a wire in which the component niobium and tin are in the unreacted state. The superconducting wire is wound around a form of suitable geometry to provide a superconducting coil. The form and coil are heated to approximately 700° C., thereby forming the superconducting intermetallic niobium-tin compound, $Nb_3Sn$, mounted on the coil form. The high temperature reaction requires the use of refractory materials for the forms upon which the superconducting wire is coiled and heated. Copper, aluminum and their alloys, suitable for magnet applications, are unsuitable because of softening or melting near 700° C. Similarly, organic materials can not be used. A refractory material, i.e., stainless steel, are preferred for the high temperature reaction of the superconducting coil but are unsuitable for NMR magnet applications. A stainless steel form is preferred for the high temperature reaction of the superconducting coils, while a non-magnetic material is preferred for the magnetic applications of the superconducting coils.

It is an object of the present invention to provide a superconducting coil and method for its manufacture on a non-magnetic form which does not disrupt the magnetic field of the superconducting magnetic.

It is a further object of the present invention to provide a coil form which is capable of assembly and disassembly and suitable for use at high temperatures for the preparation of superconducting coils.

SUMMARY OF THE INVENTION

According to one aspect of the present invention, a coil form for supporting a superconducting coil during high temperature treatment is provided which is capable of assembly and disassembly. The coil form includes a bore tube made of a refractory material which has a terminal end and an opposite end, a terminal flange made of a non-magnetic refractory material which is connected to the terminal end of the bore tube and an end flange made of a refractory material, which is removably positioned adjacent to the opposite end of the bore tube. Securing means are provided for fastening the terminal flange to the bore tube. A terminal plate is removably positioned adjacent to the terminal end of the bore tube and an end plate is removably positioned adjacent to the end flange. An axial force is exerted on the terminal and end plates so as to secure the bore tube to the end flange, so that a superconductor wire can be wound around the outer surface of the bore tube to form a superconducting coil. Because the coil form is assembled from refractory materials, the high temperature process which converts the precursor wire into a superconductor can be carried out directly on the coil form without deformation of the superconducting coil geometry or degradation of magnetic properties.

In preferred embodiments, the terminal flange is a ring contactingly surrounding the terminal end of the bore tube. The terminal flange may additionally include an integral collar at a position closest to the bore tube. The securing means may be a plurality of fasteners passing through aligned apertures of the terminal flange and the terminal end of the bore tube. Possible fasteners include bolts, screws and pins.

In other preferred embodiments, means of exerting an axial force on the terminal and end plates include opposing forces exerted on the exposed faces of the terminal and end plates. In particular, it may be a threaded rod passing through a central hole in the terminal and end plates with nuts threaded onto the ends of the threaded rod and secured against the faces of the terminal and end plates.

In preferred embodiments, insulating means are provided for surfaces in contact with the superconducting coil to prevent adhesion of the coil to the form. The surfaces of the terminal and end flanges in contact with the superconducting coil are covered with an insulating material such as mica or glass or ceramic braid. Mica is a preferred insulation because of its ability to withstand high temperatures. The coiling surface of the bore tube typically requires no additional insulation. The glass braid that covers the superconducting wire making up the coil provides sufficient insulation.

In another aspect of the invention, a non-magnetic coil form for supporting a superconducting coil during NMR magnet applications is provided. The coil form includes a bore tube having an integral end flange made of a non-magnetic material, a terminal flange made of a non-magnetic refractory material, the terminal flange contactingly surrounding the terminal end of the bore tube and securing means for fastening the terminal flange to the bore tube at the end opposite the end flange.

The superconducting coil can be impregnated with a hardenable resin to improve its toughness and durability. Surfaces of the bore tube and integral end flange in contact with the superconducting coil may be coated with release agents known to prevent the hardenable resin from adhering to the coil form. The terminal flange is preferably insulated with mica. In another preferred embodiment, a layer of high pressure epoxy-fiberglass laminate insulation (G-10) is disposed between the superconducting coil and the release agent-coated end flange to ensure freedom of movement to the superconducting coil.

In yet another aspect of the present invention, a method for preparing a superconducting coil on a non-magnetic coil form is provided. The method includes providing a temporary coil form made of refractory materials with high temperature stability, the coil form capable of assembly and disassembly, winding an unreacted wire onto the temporary coil form, reacting the wound unreacted wire at high temperatures to form a superconducting coil, disassembling the temporary coil form and transferring the superconducting coil onto a permanent coil form made of a non-magnetic material. Modifications to the form, shape and number of assembleable elements constituting the temporary and permanent coil forms will be apparent to those skilled in the art with reference to the present disclosure and they are intended to be within the scope of the present invention.

Alternatively, the method includes providing a temporary coil form having as separate assembleable elements a temporary bore tube, an end flange and a terminal flange. The terminal flange is connected to a terminal end of the temporary bore tube and the end flange is connected to the opposite end of the temporary bore tube. The temporary bore tube and end flange are made of a refractory material with high temperature stability and the terminal flange is made from a non-magnetic refractory material with high temperature stability. An unreacted wire is wound onto the temporary coil form and reacted at high temperatures to form a superconducting coil. The end flange is disassembled from the temporary coil form and the temporary bore tube is displaced from the superconducting coil with a permanent bore tube having an integral end flange, the permanent bore tube and integral end flange are made from a non-magnetic material. The terminal flange is secured to end of the permanent bore tube opposite the end flange. In both methods, the temporary coil form can be the coil form described above for use during high temperature treatment.

In preferred embodiments, the superconducting coil is impregnated with a hardenable resin after transfer onto the permanent coil form to impart increased durability to the superconducting coil. The superconducting coil can also be lightly coated with a hardenable resin after heat treatment and before transfer to the permanent coil form. The resin strengthens the coil and facilitates in the transfer of the brittle superconducting coil to the permanent coil form. Gas can be forced through perforations in the temporary bore tube during the high temperature treatment to aid formation of the superconductor. Appropriate superconductors include conductive intermetallic compounds of the form $A_3B$ with an A15 crystal structure which become superconductive at cryogenic temperatures. The preferred superconductor contains niobium-tin intermetallic compound.

The present invention allows the superconducting coil to be wound on a coil form in an unreacted state and to be subjected to high temperature heat treatments on a coil form that is heat resistant. The superconducting coil can then be transferred to a coil form made of a non-magnetic material that is suitable for use in magnetic field.

BRIEF DESCRIPTION OF THE DRAWING

The invention will be described in greater detail in the following detailed description with reference to the drawings, in which.

DESCRIPTION OF THE PREFERRED EMBODIMENT

According to the present invention, a modified "wind, then react" technique is used for the preparation of superconducting coils. The "wind, then react" method uses unreacted components of the superconductor in form of wires or ribbons, typically covered with an insulative and protective coating such as glass braiding. The unreacted ribbon is wound into a coil having turns of the prescribed geometry and then reacted at high temperatures to form the superconductor. This approach has been used with the brittle intermetallic superconductor compounds since the precursor ribbons are considerably more ductile than the reacted coil. However, "wind, then react" methods require that all materials used in the preparation of the coil must be able to withstand the high temperatures used in diffusion annealing, which for niobium-tin can be as high a 700° C.

The present invention seeks to overcome this limitation by providing a temporary coil form for use in the high temperature treatment of the superconducting coil and a method for transferring the brittle superconducting coil onto a permanent coil form for use in an NMR magnet.

Figure 1:
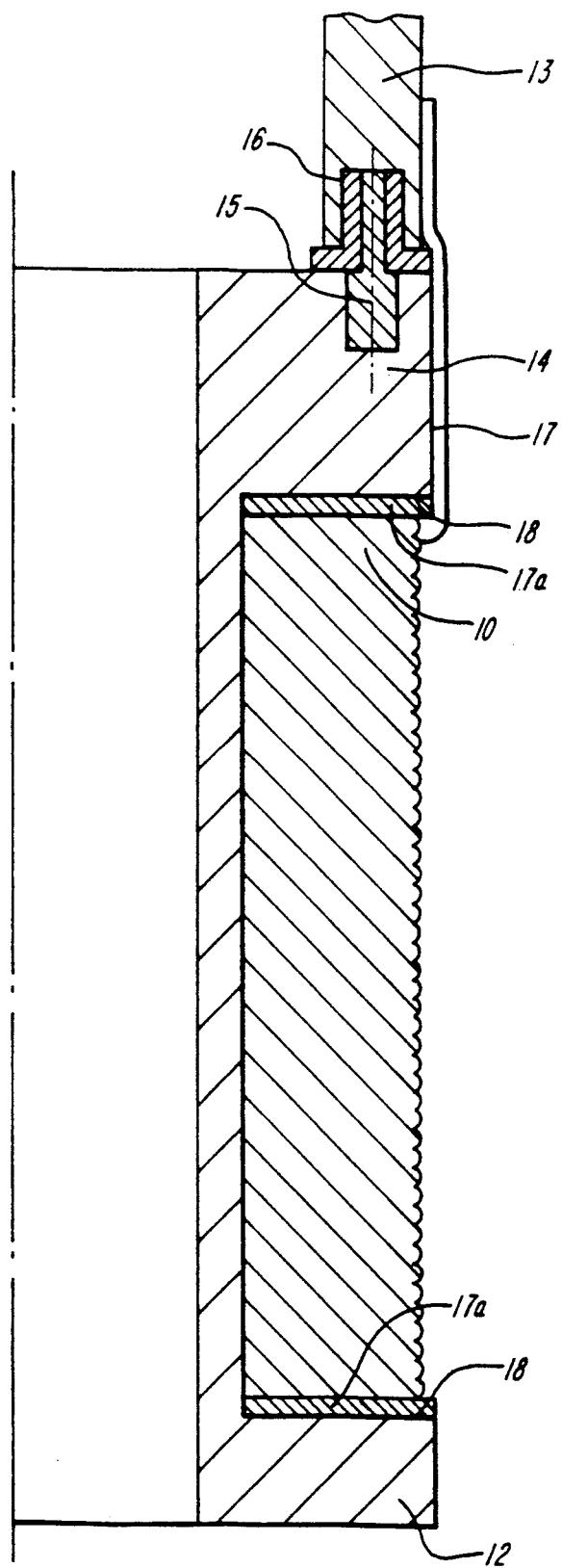
FIG. 1 is a schematic illustration of a prior art coil form.

The principle components of a prior art superconductor coil form for NMR magnet applications are shown in FIG. 1. A solenoidal winding 10 of unreacted wire is wound on a form 12 made of a refractory material capable of withstanding the high temperatures of the heat treatment to react the precursor wire and form the superconducting coil. A conductive terminal 13 is secured to a terminal end 14 of the coil form 12 by means of steel pegs 15 and a ceramic sleeve 16. A coil tail 17 is wound around the terminal end 14 of the coil form 12 and leads to the terminal 13.

Insulation 17a, such as mica or a similar refractory material, lines walls 18 of the coil form 12 in contact with the superconducting coil to prevent diffusion bonding of the superconducting coil. The coiling surface does not require additional insulation as the glass braid surrounding the windings making up the superconducting coil is usually sufficient. The glass braid of coil may be used to insulate the walls 18 of the form from diffusion bonding as well.

The coil form 12 must be non-magnetic because it will be used in NMR magnet applications. Hence, stainless steel, a preferred refractory material for high temperature applications, can not be used for the coil form. Copper is non-magnetic, however, it will soften at the temperatures used for niobium-tin. The superconducting coil expands less than form coil upon heating and the coil form buckles since it is soft. Titanium alloys are refractory and non-magnetic and hence suitable for use in the high temperature process. However, the superconducting coil has a higher coefficient of contraction than the titanium alloy resulting in a tightly wound coil. At cryogenic temperatures, the superconducting coil contracts further still until it is tightly bound to the coil form and unable to relieve the stresses that develop during charging of the magnet. As the superconducting coil tries to break away from the coil form surface, local friction and heat develop which degrade the magnetic field. Therefore, the prior art has been unable to provide a suitable coil form for use in NMR magnetic applications.

Figure 2:
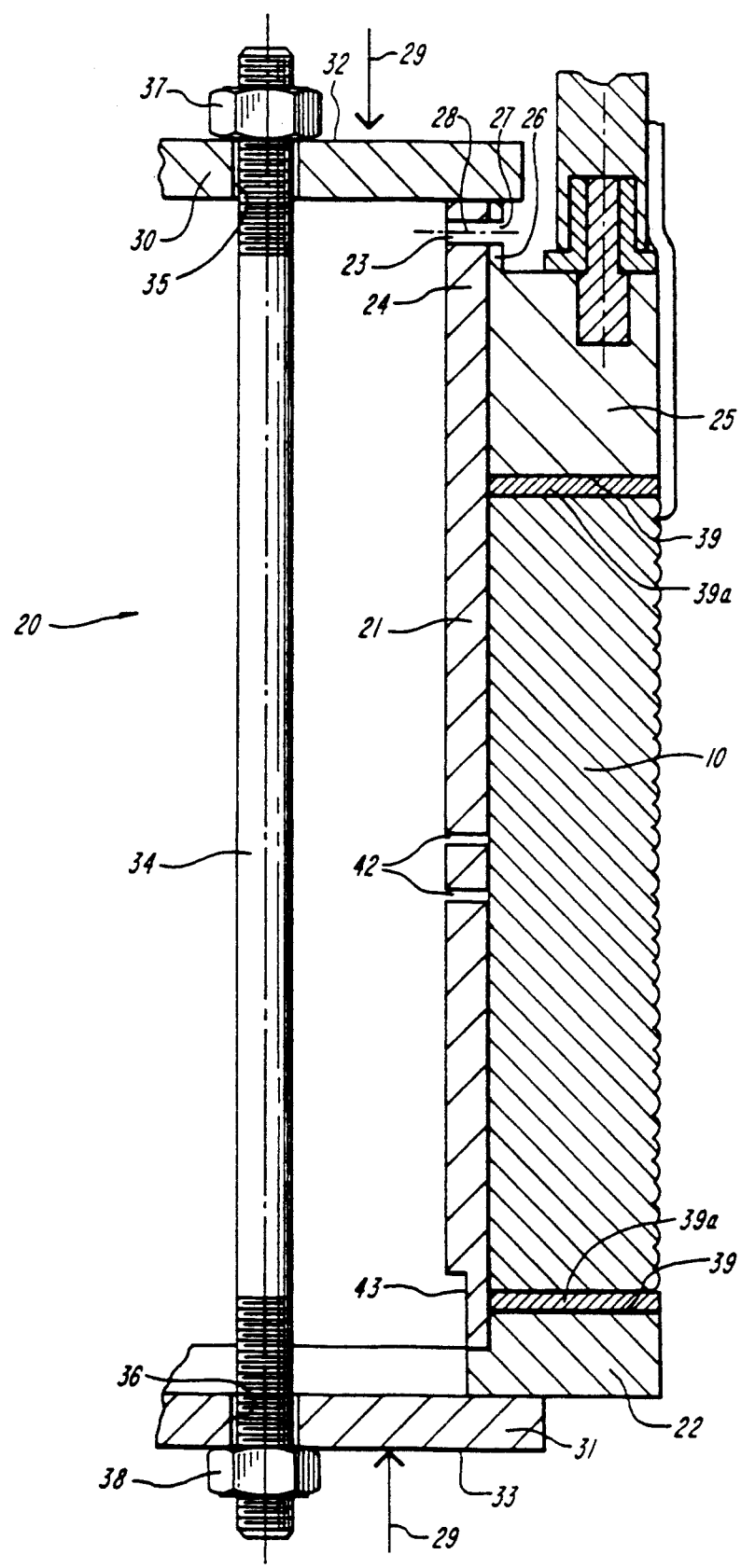
FIG. 2 is a schematic illustration of a superconducting coil form for use in high temperature environments.

Referring to FIG. 2, modifications to a coil form which overcomes the problems associated with the prior art are illustrated. A temporary form 20 consists of several elements capable of assembly and disassembly. A bore tube 21 and an end flange 22 are made from a refractory material, and more typically, from a refractory metal. The bore tube 21 contains a plurality of apertures 23 at a terminal end 24. A terminal flange 25 is secured to the terminal end 24 of bore tube 21. Any conventional means for removably securing the terminal and the end flange to the central tube are within the scope of the present invention. For this purpose, the terminal flange may have an integral collar 26 containing a plurality of apertures 27. The bore tube 21 is joined to the terminal flange 25 by means of fasteners 28 passing through aligned apertures 23 and 27. The end flange 22 is held to the bore tube 21 by means of an axial force shown by arrows 29 exerted on terminal and end plates 30 and 31, respectively.

The axial force 29 may be provided by any conventional means, such as pressing or clamping plates 30 and 31 together using external opposing forces on the outer faces 32 and 33 of the plates 30 and 31, respectively. A preferred method is illustrated in FIG. 2 in which a threaded rod 34 passes through axially aligned holes 35 and 36 in plates 30 and 31, respectively. Nuts 37 and 38 are screwed against faces 32 and 33 to exert the desired axial force. A solenoidal winding 10 of unreacted wire is wound on coil form 20 and reacted to form the superconducting coil as described hereinabove.

As materials for the bore tube 21 and end flange 22, stainless steel is the preferred material. As discussed above when addressing the problems of the prior art, other refractory and non-magnetic materials are inferior. As materials for the terminal flange 25, non-magnetic refractory materials which can be easily machined are advantageously used. A preferred material is a titanium-based alloy, such as TiVAl, however, the flange may be made of other high melting point alloys and refractory ceramic. Suitable refractory ceramics may change into the hard ceramic state after a special anneal, i.e., MACOR. In all cases, suitable materials are non-magnetic.

Walls 39 of the coil form may be lined with mica or other refractory material 39a to prevent adhesion of the superconducting coil to the form. Alternatively, if the wire of the coil is insulated with glass or ceramic braid, the walls may be unlined. The bore tube 21 may optionally contain perforations 42 through which gases pass to the superconducting coil during high temperature reaction. The gas is introduced through an inlet in the end or terminal plate (not shown) into the volume of the bore from whence it can exit only through perforations 42.

Figure 3:
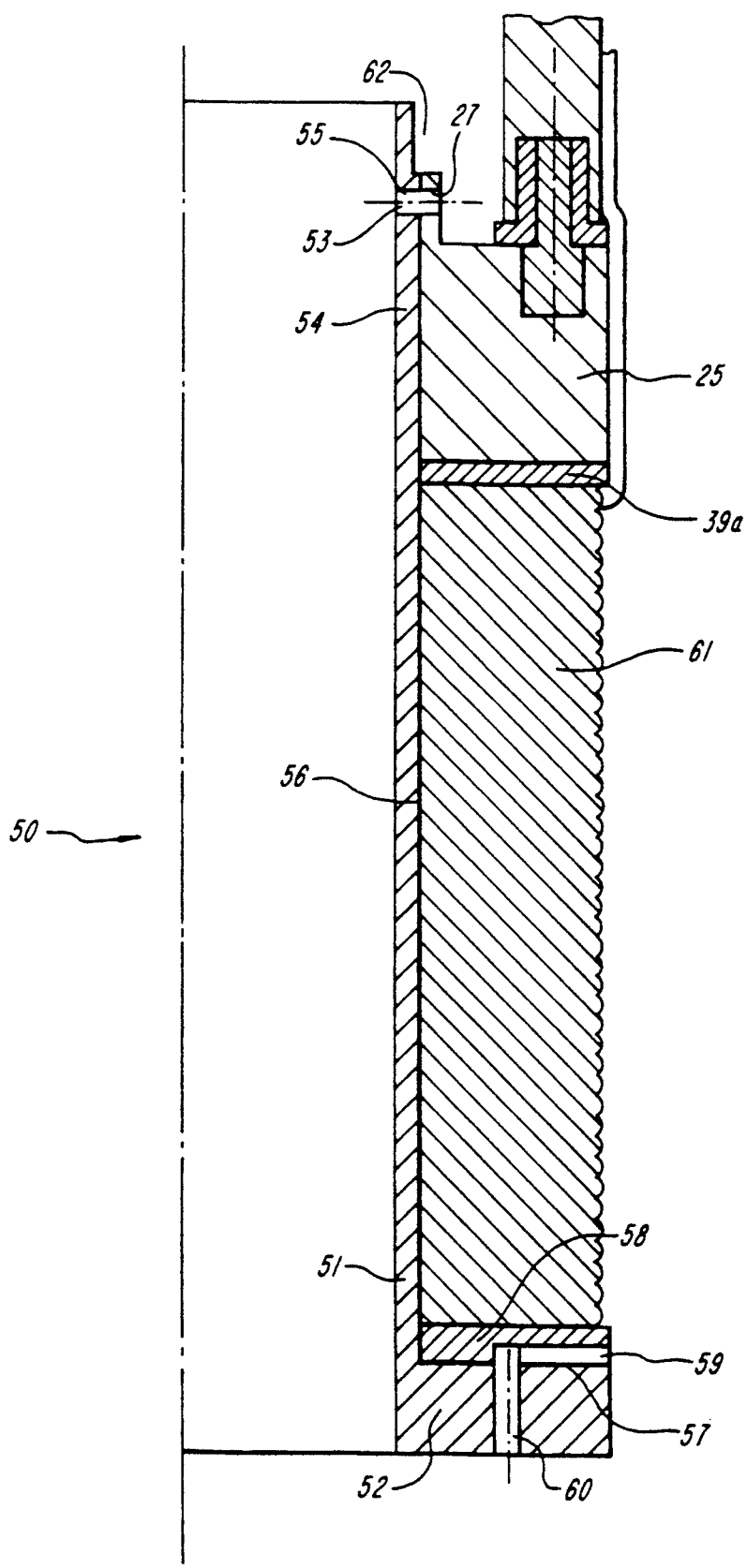
FIG. 3 is a schematic illustration of a superconducting coil form for use in a magnetic field.

A permanent non-magnetic coil form 50 for use in NMR magnetic applications is illustrated in FIG. 3. The permanent coil form 50 has a bore tube 51 with an integral end flange 52. The terminal flange 25 of the temporary coil form 50 is connected to the new bore tube 51 through apertures 53 found in a terminal end 54 of the bore tube 51. Securing means include fasteners 55 passing through aligned apertures 27 and 53. Alternatively, more permanent securing means such as welding or resin bonding are possible.

Finally, the superconducting coil is impregnated with a hardenable resin either by vacuum process, wicking or some other suitable means. Epoxy is a preferred resin, however, it tends to adhere to the coil form. To prevent adhesion, a winding surface 56 of the bore tube 51 and wall 57 of the end flange 52 may be coated with a release agent. Because the permanent coil will not be exposed to high temperatures, a variety of release agents can be used. Preferred release agents are polytetrafluoroethylene and silicone-based release agents. Hence, the present invention provides means for treating the coil form such that the epoxy resin can not bond on the coil form and which can not be obtained with the mica-insulating layers of the prior art.

Alternatively, a high pressure epoxy-fiberglass composite disk 58 (such as G-10) may be inserted between the release agent-treated end flange and the superconducting coil. The disk 58 bonds to the epoxy impregnated by but slides on the coated end flange. A radial groove 59 in the disk 58 engages a pin 60 in the end flange. This arrangement prevents rotation of the superconducting coil on the bore tube. These release agents superior to mica of the prior art are only available in the present invention because the non-magnetic coil form is not be exposed to high temperature.

Transfer of the superconducting coil from the temporary coil form to the permanent coil form is accomplished as follows.

After high temperature treatment, the superconducting coil may be treated with a light coating of resin so that only the outer layers are bonded together. This imparts increased durability to the coil and ensures the integrity of the windings. However, the coil is sufficiently sturdy so that this step is not required. The removal of the bore tube 21 and end flange 22 is accomplished in the vertical position as indicated in FIGS. 2 and 3. The fasteners 28 are removed from the bore tube 21 and terminal flange 25. The nuts 37 and 38 are then removed so that the plates 30 and 31 can be removed together with the end flange 22. Mica insulation remaining on the superconducting coil after removal of the end flange 22 may be removed. Disk 58 is inserted in its place. The new bore tube 51 with integral end flange 52 is then pushed towards the terminal flange 25 while displacing bore tube 21. Bore tube 21 slides underneath terminal flange 25 without disturbing the superconducting coil 61. The bore tube 51 may be keyed to the end of bore tube 21 by means of a complementary shoulders 43 at the end of the bore tube 21 and 62 at the terminal end 54 of bore tube 51. When the new bore tube 51 is fully home, the pins 55 are inserted to secure it to the terminal flange 25. More permanent securing means can be used as discussed hereinabove.

The resulting superconducting coil on a permanent non-magnetic coil form is advantageously free from and non-adhered to the coil form. The coil form may be of almost any material providing that it is non-magnetic. For the first time, a wide range of materials are available for use in the making of coil forms that are incompatible with the high temperature process, but desirable for magnetic applications. An additional advantage to the present invention is that the non-magnetic bore tube can be thinner than would be allowed by the stresses arising from the high temperature reaction.

What is claimed is:

1. A refractory metal coil form for a superconducting coil capable of assembly and disassembly, comprising:
   a bore tube having a terminal end and an opposite end, the bore tube comprised of steel;
   a terminal flange adjacent to the terminal end of the bore tube, the terminal flange comprised of a non-magnetic refractory material capable of withstanding temperatures of about 700° C. without softening;

a first means for securing the terminal flange to the bore tube;

an end flange removably positioned adjacent to the opposite end of the bore tube, the end flange comprised of a refractory material capable of withstanding temperatures of about 700° C. without softening;

a second means for securing the end flange to the bore tube, such that a superconductor wire can be wound around the outer surface of the bore tube to form a superconducting coil and such that the form can be disassembled after the superconducting coil is wound.

2. A refractory metal coil form for a superconducting coil capable of assembly and disassembly, comprising:

a bore tube having a terminal end and an opposite end, the bore tube comprised of steel;

a terminal flange connected to the terminal end of the bore tube, the terminal flange comprised of a non-magnetic refractory material capable of withstanding temperatures of about 700° C. without softening;

a means for securing the terminal flange to the bore tube;

an end flange removably positioned adjacent to the opposite end of the bore tube, the end flange comprised of a refractory material capable of withstanding temperatures of about 700° C. without softening;

a terminal plate removably positioned adjacent to the terminal end of the bore tube;

an end plate removably positioned adjacent to the end flange; and means for exerting an axial force on the terminal and end plates so as to secure the end flange to the bore tube, such that a superconductor wire can be wound around the outer surface of the bore tube to form a superconducting coil and such that the form can be disassembled after the superconducting coil is wound.

3. The form of claim 1 or 2 wherein the terminal flange comprises a ring contactingly surrounding the terminal end of the bore tube.

4. The form of claim 3 wherein the ring further comprises an integral collar at a location closet to the bore tube contactingly surrounding the terminal end of the bore tube.

5. The form of claim 1 or 2 wherein the securing means comprises:

a plurality of fasteners passing through a plurality of aligned apertures in the terminal flange and terminal end of the bore tube.

6. The form of claim 1 or 2 wherein the securing means comprises:

a bore tube having a plurality of apertures in the terminal end a terminal flange with an integral collar having a plurality of apertures in the collar such that the apertures of the bore tube and terminal flange are aligned; and a plurality of fasteners passing through the aligned apertures.

7. The form of claim 1 or 2 wherein the end flange further comprises:

a groove along an inner circumference such that the opposite end of the bore tube is in engagement with the groove of the end flange.

8. The form of claim 1 or 2 wherein the means of exerting an axial force on the terminal and end plates comprises:

opposing forces exerted on outer faces of the terminal and end plates.

9. The form of claim 1 or 2 wherein the means of exerting an axial force on the terminal and end plates comprises:

a threaded rod passing through a central hole in the terminal and end plates; and nuts threaded onto the ends of the threaded rod and secured against outer faces of the terminal and end plates.

10. The form of claim 1 or 2 wherein the bore tube and end flange comprise stainless steel.

11. The form of claim 1 or 2, wherein the terminal flange is made of a material selected from the group consisting of titanium alloys, high melting point alloys of copper and machinable ceramic.

12. The form of claim 1 or 2 wherein the bore tube is perforated.

13. The form of claim 1 or 2 wherein the bore tube further comprises:

a groove along an inner circumference of the opposite end of the tube.

14. The form of claim 1 or 2 further comprising:

insulating means on the surfaces of the terminal and end flanges and bore tube in contact with the superconducting coil to prevent adhesion of the superconducting coil to the coil form.

15. A non-magnetic coil form for a superconducting coil for use in a superconducting NM magnet, comprising:

a bore tube having an integral end flange and an opposite terminal end, the bore tube and integral end flange comprised of a non-magnetic, non-refractory material;

the bore tube having an inner and outer wall and having an annular recess in the terminal end of the outer wall, capable of being engaged with a second tube for receiving a superconducting coil;

a demountable terminal flange adjacent to the terminal end of the bore tube, the terminal flange comprised of a non-magnetic refractory material capable of withstanding temperatures of about 700° C. without softening; and securing means for fastening the terminal flange to the bore tube at the terminal end of the bore tube.

16. The coil form of claim 15, wherein the terminal flange contactingly surrounds the bore tube at the terminal end.

17. The form of claim 15 further comprising:

insulating means on the surfaces of the bore tube, integral end flange and terminal flange in contact with the superconducting coil to prevent adhesion of the superconducting coil to the coil form.

18. The form of claim 15 wherein the insulation for the surfaces of the bore tube and integral end flange is a release agent capable of preventing adhesion of a resin to the coil form.

19. The form of claim 18 further comprising:

a high pressure epoxy-fiberglass composite material disposed between the superconducting coil and the release agent.

20. The form of claim 15 further comprising:

a superconducting coil impregnated with a hardenable resin.

21. The form of claim 15 wherein the non-magnetic, non-refractory material is selected from the group containing aluminum, copper and alloys of aluminum and copper.

* * * * *

UNITED STATES PATENT AND TRADEMARK OFFICE
CERTIFICATE OF CORRECTION

PATENT NO. : 5,332,988
DATED : July 26, 1994
INVENTOR(S) : Alexander Zhukovsky, et. al.

It is certified that error appears in the above-indentified patent and that said Letters Patent is hereby corrected as shown below:

Column 5, line 58, delete "50" and insert therefor -- 20--.

Signed and Sealed this

First Day of November, 1994

*Attest:*

BRUCE LEHMAN

*Attesting Officer*   Commissioner of Patents and Trademarks